United States Patent
Lo et al.

(10) Patent No.: US 9,184,254 B2
(45) Date of Patent: Nov. 10, 2015

(54) FIELD-EFFECT TRANSISTOR AND FABRICATING METHOD THEREOF

(71) Applicant: UNITED MICROELECTRONICS CORPORATION, Hsinchu (TW)

(72) Inventors: Kun-Yuan Lo, Tainan (TW); Chih-Wei Yang, Kaohsiung (TW); Cheng-Guo Chen, Changhua County (TW); Rai-Min Huang, Taipei (TW); Jian-Cun Ke, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 187 days.

(21) Appl. No.: 13/875,289

(22) Filed: May 2, 2013

(65) Prior Publication Data

US 2014/0327093 A1 Nov. 6, 2014

(51) Int. Cl.
*H01L 21/02* (2006.01)
*H01L 29/49* (2006.01)
*H01L 21/28* (2006.01)
*H01L 29/66* (2006.01)

(52) U.S. Cl.
CPC ...... *H01L 29/4966* (2013.01); *H01L 21/28088* (2013.01); *H01L 29/66545* (2013.01)

(58) Field of Classification Search
CPC ............. H01L 29/66545; H01L 29/4966; H01L 29/517; H01L 21/823842; H01L 21/28088; H01L 21/28273
See application file for complete search history.

(56) References Cited

U.S. PATENT DOCUMENTS

| | | | |
|---|---|---|---|
| 6,033,963 A | 3/2000 | Huang | |
| 6,653,698 B2 | 11/2003 | Lee | |
| 6,858,483 B2 | 2/2005 | Doczy | |
| 6,887,747 B2 * | 5/2005 | Yagishita et al. | 438/197 |
| 6,921,711 B2 | 7/2005 | Cabral, Jr. | |
| 6,953,719 B2 | 10/2005 | Doczy | |
| 6,967,131 B2 | 11/2005 | Saenger | |
| 6,972,225 B2 | 12/2005 | Doczy | |
| 7,029,966 B2 | 4/2006 | Amos | |
| 7,056,794 B2 | 6/2006 | Ku | |
| 7,064,050 B2 | 6/2006 | Cabral, Jr. | |
| 7,064,066 B1 | 6/2006 | Metz | |
| 7,074,680 B2 | 7/2006 | Doczy | |
| 7,112,851 B2 | 9/2006 | Saenger | |
| 7,126,199 B2 | 10/2006 | Doczy | |
| 7,148,548 B2 | 12/2006 | Doczy | |
| 7,153,734 B2 | 12/2006 | Brask | |
| 7,157,378 B2 | 1/2007 | Brask | |
| 7,183,184 B2 | 2/2007 | Doczy | |

(Continued)

OTHER PUBLICATIONS

U.S. Appl. No. 13/778,227, filed Feb. 27, 2013. First Named Inventor: Chen, Chien Hao Title Layout Decomposition Method and Method for Manufacturing Semiconductor Device Applying the Same.

(Continued)

*Primary Examiner* — Zandra Smith
*Assistant Examiner* — John M Parker
(74) *Attorney, Agent, or Firm* — Ding Yu Tan

(57) ABSTRACT

A field-effect transistor comprises a substrate, a gate dielectric layer, a barrier layer, a metal gate electrode and a source/drain structure. The gate dielectric layer is disposed on the substrate. The barrier layer having a titanium-rich surface is disposed on the gate dielectric layer. The metal gate electrode is disposed on the titanium-diffused surface. The source/drain structure is formed in the substrate and adjacent to the metal gate electrode.

13 Claims, 5 Drawing Sheets

(56) References Cited

U.S. PATENT DOCUMENTS

| | | |
|---|---|---|
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,390,709 B2 | 6/2008 | Doczy |
| 2005/0051854 A1* | 3/2005 | Cabral et al. .................. 257/407 |
| 2007/0045753 A1 | 3/2007 | Pae |
| 2007/0262451 A1 | 11/2007 | Rachmady |
| 2009/0039433 A1 | 2/2009 | Yang |
| 2009/0057769 A1 | 3/2009 | Wei |
| 2009/0186458 A1 | 7/2009 | Yu |
| 2010/0052066 A1 | 3/2010 | Yu |
| 2010/0065926 A1 | 3/2010 | Yeh |
| 2010/0068877 A1 | 3/2010 | Yeh |
| 2012/0319214 A1* | 12/2012 | Ma et al. ........................ 257/410 |
| 2013/0280900 A1* | 10/2013 | Lai et al. ........................ 438/589 |

OTHER PUBLICATIONS

Veloso, A.; Ragnarsson, L.; Cho, M.J.; Devriendt, K.; Kellens, K.; Sebaai, F.; Suhard, S.; Brus, S.; Crabbe, Y.; Schram, T.; Rohr, E.; Paraschiv, V.; Eneman, G.; Kauerauf, T.; Dehan, M.; Hong, S.-H.; Yamaguchi, S.; Takeoka, S.; Higuchi, Y.; Tielens, H.; Van Ammel, A.; Favia, P.; Bender, H.; Franquet, A.; Conard, T.; Li, X.; Pey, K.-L., Struyf, H.; Mertens, P.; Absil, P.P.; Horiguchi, N.; Hoffmann, T., Gate-Last vs. Gate-First Technology for aggressively scaled EOT Logic/RF CMOS, VLSI Technology (VLSIT), 2011 Symposium on Jun. 14-16, 2011, pp. 34-35, Conference Publications.

* cited by examiner

FIELD-EFFECT TRANSISTOR AND FABRICATING METHOD THEREOF

FIELD OF THE INVENTION

The present invention relates to a semiconductor device and the method for fabricating the same, and more particularly to a field-effect transistor and the fabricating method thereof.

BACKGROUND OF THE INVENTION

As the demand on the device integration of an integrated circuit is gradually increased, the feature size of a semiconductor device (e.g. a field-effect transistor) becomes smaller and smaller, and the thickness of a gate oxide layer of the field effect transistor is reduced. For maintaining the dielectric performance and reducing current leakage, the gate oxide layer of the semiconductor device is usually made of a high-k material.

Moreover, since the doping capacity of the conventional poly-silicon gate electrode is limited, the efficacy of using the doped poly-silicon gate electrode to improve the threshold voltage is usually insufficient. Nowadays, for solving the problems resulting from reduction of the device feature size, the poly-silicon gate electrode is gradually replaced by a metal gate electrode.

However, this approach still has some drawbacks and problems. As to the process for forming a field-effect transistor with a metal gate electrode, it is necessary to remove a dummy poly-silicon gate electrode prior to forming a metal gate electrode to take the place of the dummy poly-silicon gate electrode. However, the process for removing the dummy poly-silicon gate electrode could damage a barrier layer overlaying on a gate dielectric layer of the field-effect transistor. Thus, current leakage of the field-effect transistor may be increased and punch through effect may occur due to metal atom penetrating through the damaged burlier layer and diffusing into the gate dielectric layer during the forming of the metal gate electrode.

Therefore, there is a need of providing an improved field-effect transistor and the fabricating method thereof to obviate the drawbacks encountered from the prior art.

SUMMARY OF THE INVENTION

In accordance with one aspect, the present invention provides a field-effect transistor comprises a substrate, a gate dielectric layer, a barrier layer, a metal gate electrode and a source/drain structure. The gate dielectric layer is disposed on the substrate. The barrier layer having a titanium-rich surface is disposed on the gate dielectric layer. The metal gate electrode is disposed on the titanium-rich surface. The source/drain structure is formed in the substrate and adjacent to the metal gate electrode.

In one embodiment of the present invention, the field-effect transistor further comprises a U-shaped work function layer disposed between the titanium-rich surface and the metal gate electrode.

In one embodiment of the present invention, the field-effect transistor is a P type metal-oxide-semiconductor (PMOS) transistor, and the work function layer comprises titanium nitride (TiN).

In one embodiment of the present invention, the field-effect transistor is an NMOS transistor, and the work function layer comprises tantalum nitride (TaN), aluminum nitride (AlN) or the combination thereof.

In one embodiment of the present invention, the metal gate electrode comprises copper (Cu), aluminum (Al) or the combination thereof.

In one embodiment of the present invention, the barrier layer has a thickness substantially of 20 Å.

In one embodiment of the present invention, the dielectric layer is made of material selected from a group consisting of hafnium silicon, hafnium oxide, hafnium silicon oxide, hafnium silicon oxynitride, hafnium silicon nitride, hafnium aluminum oxide, aluminum oxide, titanium oxide, strontium titanium oxide, tantalum oxide, zirconium oxide, zirconium silicon oxide, lead lanthanum, zirconate titanate, barium strontium titanate and a combination thereof.

In one embodiment of the present invention, the dielectric layer further comprises an interface layer made of silicon oxide or silicon nitride directly in contact with the substrate.

In accordance with another aspect, the present invention provides a method for fabricating a field-effect transistor, wherein the method comprises steps as follows: Firstly, a gate dielectric layer and a barrier layer are formed on a substrate in sequence. A first silicon layer is then formed on and in contact with the barrier layer. A thermal treatment is performed to form a silicide layer between the barrier layer and the first silicon layer. Subsequently, a second silicon layer is formed on and in contact with the first silicon layer.

In one embodiment of the present invention, the thermal treatment comprises a spike annealing process or a soak annealing process.

In one embodiment of the present invention, the second silicon layer has a thickness substantially greater than that of the first silicon layer. In one embodiment of the present invention, the first silicon layer has a thickness substantially ranging from 40 Å to 200 Å.

In one embodiment of the present invention, after the forming of the second silicon layer, the method further comprises steps of patterning the second silicon layer, the first silicon layer, the barrier layer and the gate dielectric layer to form a dummy gate structure; and forming a metal gate electrode to take the place of the patterned second silicon layer and the first silicon layer.

In one embodiment of the present invention, the method further comprises performing a plurality of ion implant processes on the substrate to form a source/drain structure in the substrate prior to the forming of the metal gate electrode.

In one embodiment of the present invention, the process for forming a metal gate electrode to take the place of the patterned second silicon layer and the first silicon layer comprises steps of removing the patterned second silicon layer and the first silicon layer to form an opening in the dummy gate structure; forming at least one U-shaped work function layer on sidewalls of the opening; and forming a metal layer on the U-shaped work function layer, so as to fill the opening.

In one embodiment of the present invention, a titanium-rich surface is formed on the barrier layer and in contact with the silicide layer after the thermal treatment is carried out.

In one embodiment of the present invention, the silicide layer can be simultaneously removed in the step of removing the patterned second silicon layer and the first silicon layer, so as to form a titanium-diffused surface.

In accordance with the aforementioned embodiments of the present invention, a field-effect transistor with a metal gate electrode and the method for fabricating the same are provided, wherein the at least two silicon layers are formed on a gate dielectric layer and a barrier layer serving as a dummy gate electrode. After a first silicon layer is formed directly in contact with the barrier, a thermal treatment is then performed thereon, so as to form a silicide layer between the first silicon layer and the barrier layer, and another silicon layer is subsequently formed on the first silicon layer.

Since the silicide layer that has an essential characteristic for blocking metal atom diffusion serves as an etching stop layer of the etching process for removing the dummy gate electrode, thus the barrier layer that is disposed under the silicide layer can be protected from being damaged by the etching process, and metal atoms can be prevented from penetrating through the barrier layer and diffusing into the gate dielectric layer during the subsequent metal gate electrode forming process, and the current leakage of the field-effect transistor and the susceptibility of punch through effect may be significantly reduced. Accordingly, the performance of the field-effect transistor can be improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
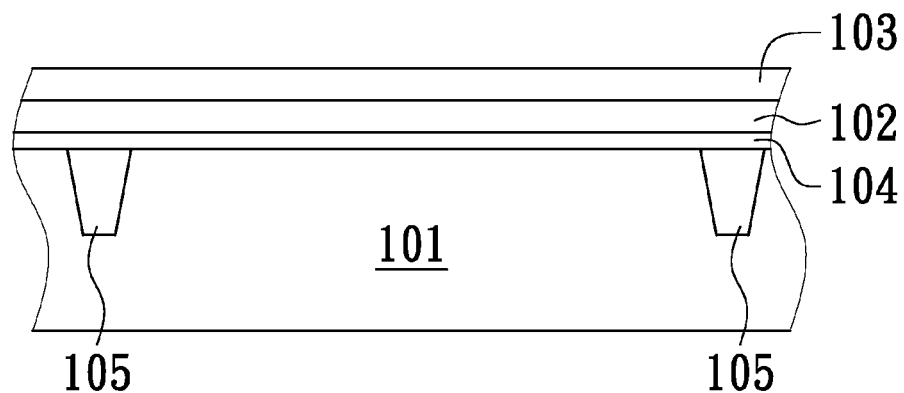
FIGS. 1A-1H are cross-sectional views of the processing structures for fabricating a field-effect transistor in accordance with one embodiment of the present invention.

A field-effect transistor with a metal gate electrode and the method for fabricating the same are provided by the present invention to prevent metal atoms from penetrating through a barrier layer and diffusing into the gate dielectric layer during the forming of the metal gate electrode and thereby solving the problems of current leakage and punch through effect. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A-1H are cross-sectional views of the processing structures for fabricating a field-effect transistor 100 in accordance with one embodiment of the present invention, wherein the method for fabricating the field-effect transistor 100 comprises steps as follows:

Firstly, a gate dielectric layer 102 and a barrier layer 103 are formed on a substrate 101 in sequence. In addition, a silicon oxide based interface layer (IL) 104 is formed on and directly in contact with the substrate 101 prior to the forming of the gate dielectric layer 102 in the present embodiment. However, in some other embodiments, the gate dielectric layer 102 may alternatively be formed on and directly in contact with the substrate 101. In some other embodiments, a plurality of shallow trench isolations 105 are formed in the substrate 101 prior to the forming of the IL 104, the gate dielectric layer 102 and the barrier layer 103 (see FIG. 1A).

The gate dielectric layer 102 may be a dielectric layer made of material with a high dielectric constant which also referred as high-k dielectric layer. The material used to form the gate dielectric layer 102 comprises hafnium silicon, hafnium oxide, hafnium silicon oxide, hafnium silicon oxynitride, hafnium silicon nitride, hafnium aluminum oxide, aluminum oxide, titanium oxide, strontium titanium oxide, tantalum oxide, zirconium oxide, zirconium silicon oxide, lead lanthanum, zirconate titanate, barium strontium titanate or a combination thereof. The barrier layer 103 preferably is made of TiN. In some embodiments of the present invention, the IL 104 has a thickness ranging from 5 Å to dozens of angstroms. However, in a preferred embodiment, the thickness of the IL 104 is substantially of 10 Å. The thicknesses of the gate dielectric layer 102 and the barrier layer 103 both range from 10 Å to dozens of angstroms, and preferably are both about 20 Å, respectively.

Next, a first silicon layer 107 is formed on and in contact with the barrier layer 103. In some embodiments, the first silicon layer 107 has a thickness substantially ranging from dozens of angstroms to hundreds of angstroms, and preferably ranging from 40 Å to 200 Å. In the present embodiment, the thickness of the first silicon layer 107 is about 100 Å.

Figure 1B:
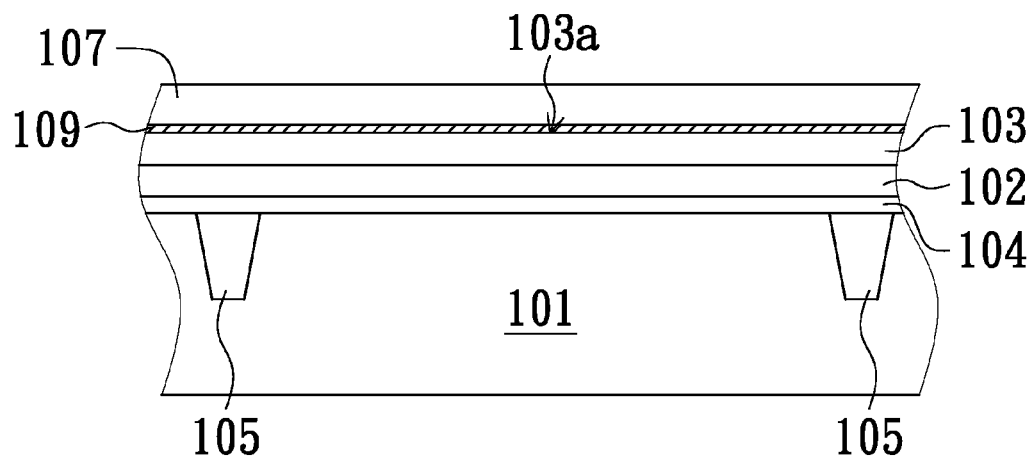

A thermal treatment 108 is then performed on the first silicon layer 107 to trigger an inter diffusion and/or interface reaction of titanium atoms coming from the barrier layer 103 and silicon atoms coming from the first silicon layer 107, so as to form a silicide layer 109 disposed between the first silicon layer 107 and the barrier layer 103 (see FIG. 1B). Since the titanium concentration of a surface 103a of the barrier layer 103 that is directly in contact with the silicide layer 109 is greater than the titanium concentration within the barrier layer 103, thus the surface 103a of the barrier layer 103 directly in contact with the silicide layer 109 is hereinafter denominated as a titanium-rich surface 103a.

Figure 1C:
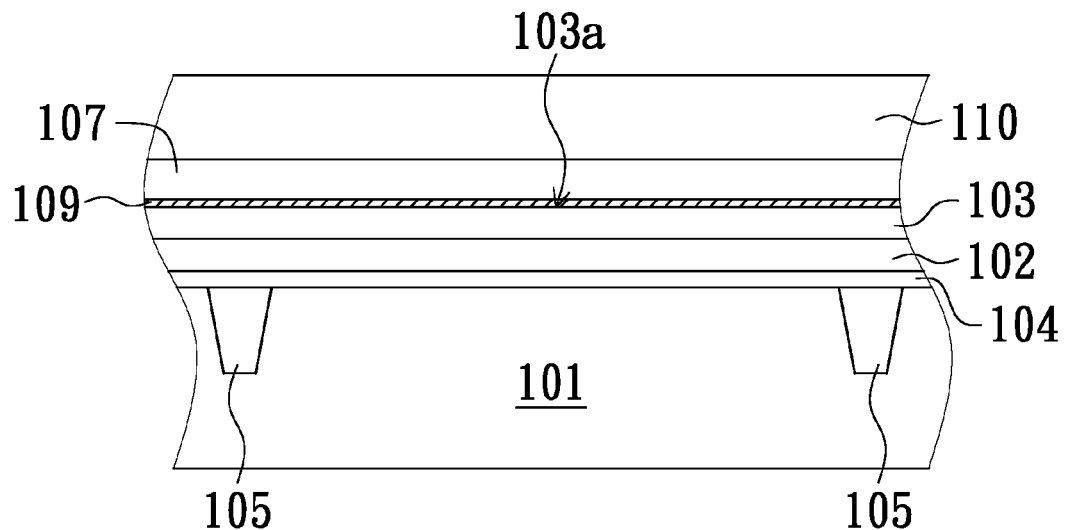
Figure 1D:
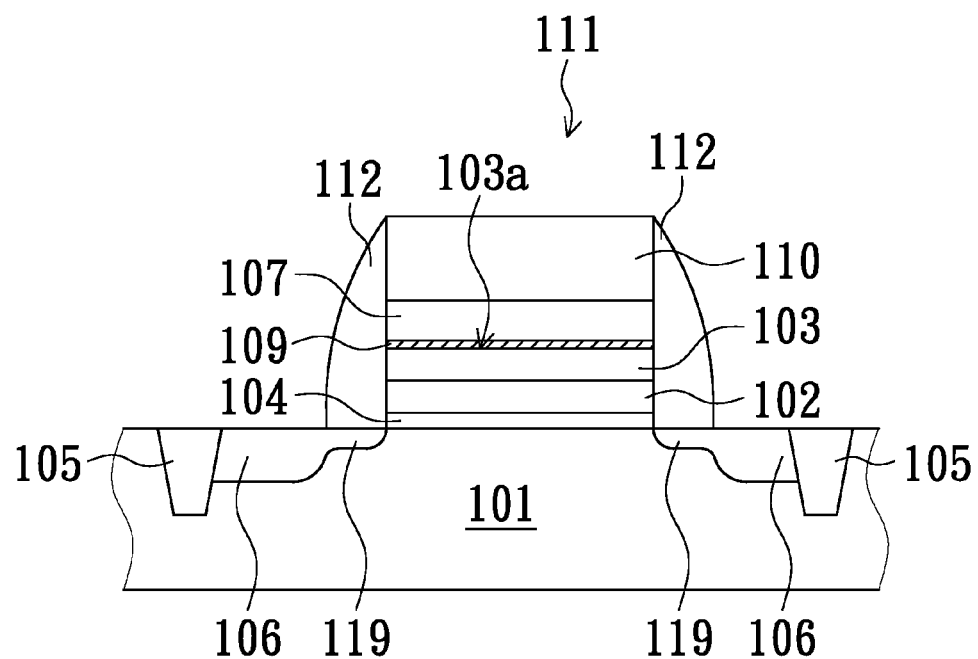

Subsequently, a second silicon layer 110 is formed on and in contact with the first silicon layer 107 (see FIG. 1C). In the embodiments of the present invention, the second silicon layer 110 has a thickness substantially greater than that of the first silicon layer 107. In some embodiments of the present invention, the thickness of the second silicon layer 110 may range from 100 Å to hundreds of angstroms, and preferably is about 450 Å.

The first silicon layer 107 and the second silicon layer 110 may have either identical or different crystal phases. For example, in one embodiment, both of the first silicon layer 107 and the second silicon layer 110 are made of either amorphous silicon or poly silicon. However in another embodiment, the first silicon layer 107 is made of amorphous silicon, while the second silicon layer 110 is made of poly silicon. In yet another embodiment, the first silicon layer 107 is made of poly silicon, while the second silicon layer 110 is made of amorphous silicon.

Thereafter, the second silicon layer 110, the first silicon layer 107, the silicide layer 109, the barrier layer 103, the gate dielectric layer 102 and the IL 104 are patterned by an etching process to form a dummy gate structure 111 on the substrate 101.

An ion implant process using the dummy gate structure 111 as a mask is then performed to form a plurality of light doped drain (LDD) regions 119 in the substrate 101; a spacer 112 is subsequently formed on the sidewalls of the dummy gate structure 111; and a plurality of ions are further implanted into and through the LDD regions 119 to form a source/drain structure 106 in the substrate 101 (see FIG. 1D) by using the dummy gate structure 111 and the spacer 112 as a mask.

For example, in the present embodiment, a plurality of N type ions are implanted into the substrate 101 to form an N type source/drain structure 106. Alternatively, in some other embodiments of the present invention, a plurality of P type ions are implanted into the substrate 101 to form a P type source/drain structure 106.

Figure 1E:
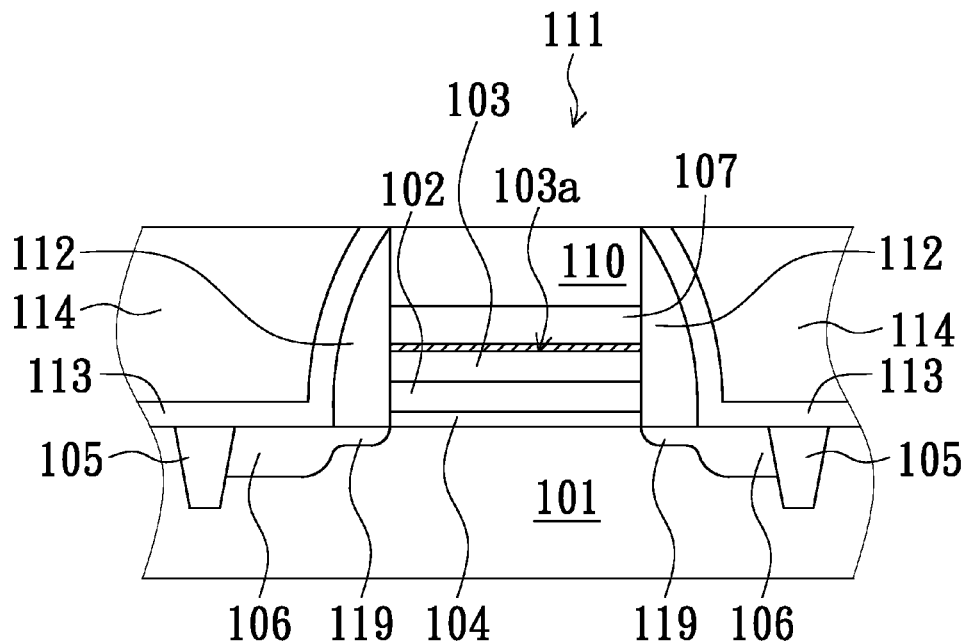

Next, a contact etching stop layer (CESL) 113 and an inter-layer dielectric (ILD) layer 114 are formed on the substrate 101 and the dummy gate structure 111, and a planarization process, such as a chemical mechanical polishing (CMP) process, and/or an etching process is performed to remove a portion of the CESL 113 and the ILD layer 114, so as to expose the patterned second silicon layer 110 of the dummy gate structure 111 (see FIG. 1E).

Figure 1F:
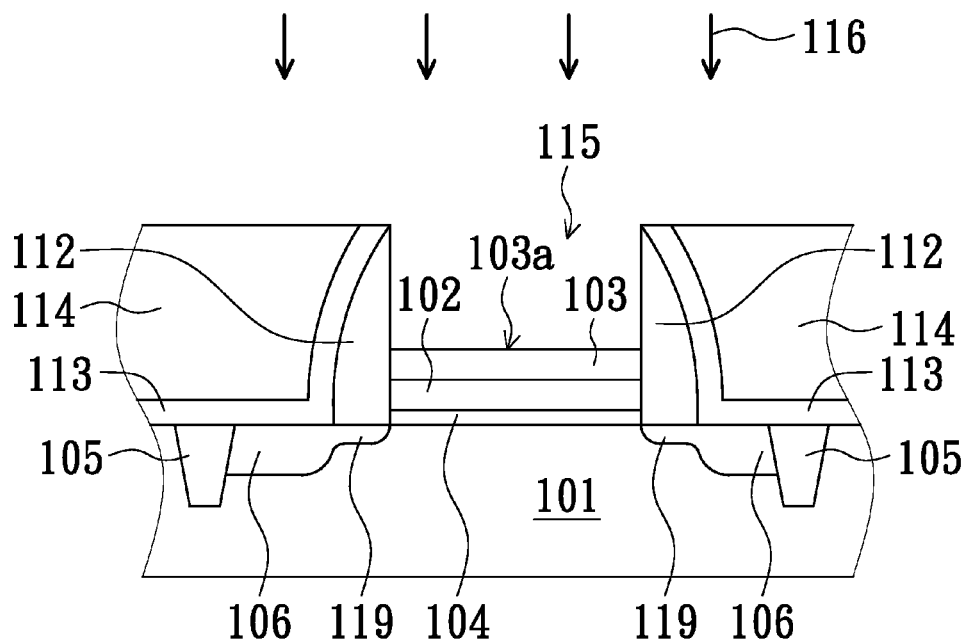

An etching process 116 using the silicide layer 109 as an etch stop layer is then performed to remove the patterned second silicon layer 110 and the first silicon layer 107, so as to form an opening 115 in the dummy gate structure 111 and expose the titanium-rich surface 103a of the barrier layer 103 through the opening 115 (see FIG. 1F).

In some embodiments of the present invention, the etching process 116 for removing the patterned second silicon layer 110 and the first silicon layer 107 may be a dry etching process in an atmosphere of carbon tetrafluoride ($CF_4$)/nitrogen ($N_2$) or ($Cl_2$) or a wet etching process carried out in a tetramethylammonium hydroxide (TMAH) solution.

Figure 1G:
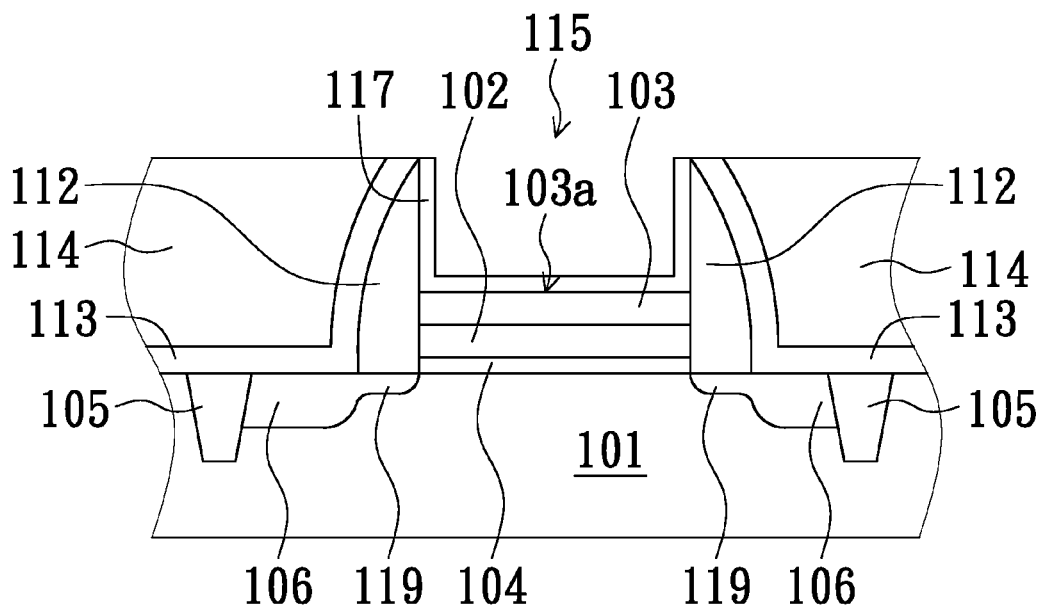

An U-shaped work function layer 117 is then formed on the titanium-rich surface 103a of the barrier layer 103 and the sidewalls of the opening 115 (see FIG. 1G). Wherein the material used to form the U-shaped work function layer 117 is selected in accordance with the electrical parameters and characteristics of the field-effect transistor 100.

For example, in the present embodiment, the field-effect transistor 100 is an NMOS, and the material used to form the U-shaped work function layer 117 may comprise tantalum nitride (TaN), aluminum nitride (AlN), titanium aluminum nitride (TiAlN) or the combination thereof. Alternatively, in some other embodiments of the present invention, the field-effect transistor 100 is a PMOS, and the material used to form the U-shaped work function layer 117 may comprise TaN and TiN.

Figure 1H:
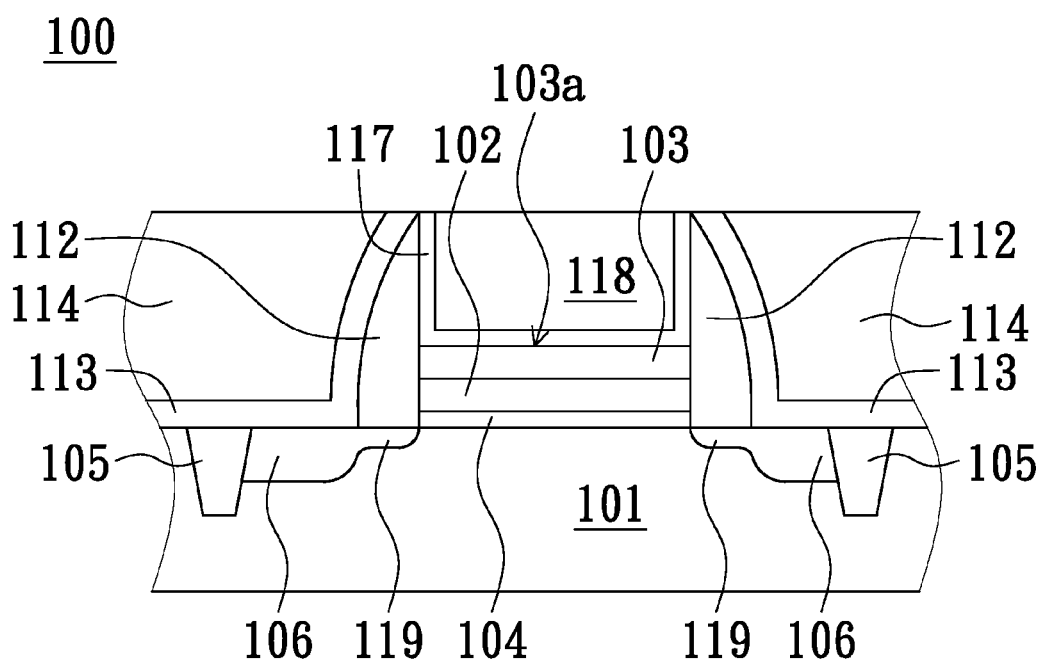

Subsequently, a metal layer comprising tungsten (W), Cu, Al or the combination thereof is formed on the CESL 113, the ILD layer 114 and the U-shaped work function layer 117, so as to fill the opening 115; and another planarization process using the ILD layer 114 as a stop layer is performed to remove a portion of the metal layer, so as to form a metal gate electrode 118 on the U-shaped work function layer 117, thereby fabricating the field-effect transistor 100 as shown in FIG. 1H. In some embodiments of the present invention, before the metal layer is formed, the method for fabricating a field-effect transistor further comprises a step of forming a titanium/aluminum (TiAl) component layer (not shown) on the work function layer 117.

Regarding to FIG. 1H, the field-effect transistor 100 formed by the aforementioned fabrication process comprises the substrate 101, the IL 104, the gate dielectric layer 102, the barrier layer 103, the U-shaped work function layer 117, the metal gate electrode 118 and the source/drain structure 106. The IL 104 and the gate dielectric layer 102 are sequentially disposed on the substrate 101. The barrier layer 103 having a titanium-rich surface 103a is disposed on the gate dielectric layer 102. The metal gate electrode 118 is disposed on the titanium-rich surface 103a of the barrier layer 103. The U-shaped work function layer 117 is disposed between the titanium-rich surface 103a of the barrier layer 103 and the metal gate electrode 118. The source/drain structure 106 is formed in the substrate 101, and is adjacent to the metal gate electrode 118.

Figure 2:
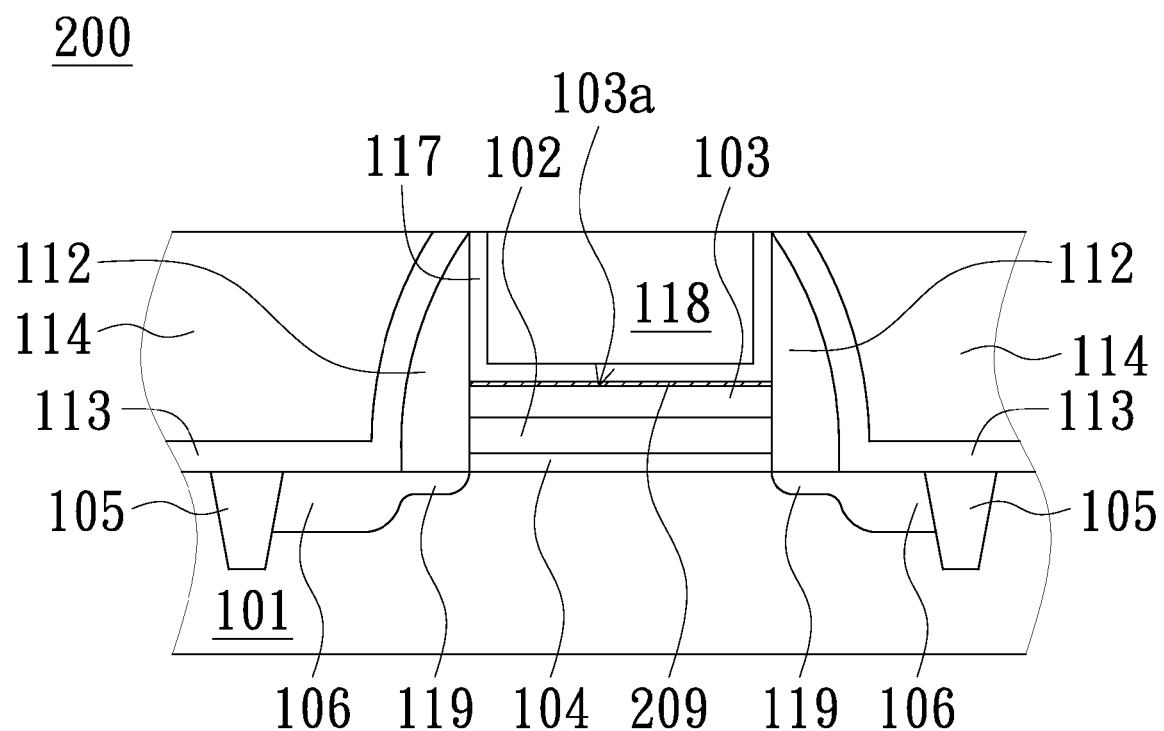
FIG. 2 illustrates a cross-sectional view of a field-effect transistor in accordance with another embodiment of the present invention.

It should be appreciated that the etching process 116 may not thoroughly remove the silicide layer 109, and a remained portion of the silicide layer 209 may otherwise instead be left behind on the titanium-rich surface 103a of the barrier layer 103. Next, a U-shaped work function layer 117 is then formed on the remained portion of the silicide layer 209 and the sidewalls of the opening 115. Subsequently, a metal layer is formed on the CESL 113, the ILD layer 114 and the U-shaped work function layer 117, so as to fill the opening 115; and an another planarization process using the ILD layer 114 as a stop layer is performed to remove a portion of the metal layer, so as to form a metal gate electrode 118 on the U-shaped work function layer 117, thereby fabricating the field-effect transistor 200 of the another embodiment as shown in FIG. 2.

In accordance with the aforementioned embodiments of the present invention, a field-effect transistor with a metal gate electrode and the method for fabricating the same are provided, wherein the at least two silicon layers are formed on a gate dielectric layer and a barrier layer serving as a dummy gate electrode. After a first silicon layer is formed directly in contact with the barrier, a thermal treatment is then performed thereon, so as to form a silicide layer between the first silicon layer and the barrier layer, and another silicon layer is subsequently formed on the first silicon layer.

Since the silicide layer that has an essential characteristic for blocking metal atom diffusion, and the silicide layer serves as an etch stop layer of the etching process for removing the dummy gate electrode, thus the barrier layer that is disposed under the silicide layer can be protected from being damaged by the etching process, and metal atoms can be prevented from penetrating through the barrier layer and diffusing into the gate dielectric layer during the subsequent metal gate electrode forming process, and the current leakage of the field-effect transistor and the susceptibility of punch through effect may be significantly reduced. Accordingly, the performance of the field-effect transistor can be improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A field-effect transistor comprising:
a substrate;
a gate dielectric layer, disposed on the substrate;
a linear-shaped barrier layer having a titanium-rich surface and disposed on the gate dielectric layer, wherein a titanium concentration of the titanium-rich surface is higher than a titanium concentration within the linear-shaped barrier layer;
a metal gate electrode, disposed above the titanium-rich surface; and
a source/drain structure, formed in the substrate and adjacent to the metal gate electrode.

2. The field-effect transistor according to claim 1, further comprising a U-shaped work function layer disposed between the titanium-rich surface and the metal gate electrode.

3. The field-effect transistor according to claim 2, wherein the field-effect transistor is a P type metal-oxide-semiconductor (PMOS) transistor and the work function layer comprises titanium nitride (TiN).

4. The field-effect transistor according to claim 2, wherein the field-effect transistor is an N type metal-oxide-semiconductor (NMOS) transistor and the work function layer comprises tantalum nitride (TaN), aluminum nitride (AlN), titanium aluminum nitride (TiAlN) or the combination thereof.

5. The field-effect transistor according to claim 1, wherein the metal gate electrode comprises copper (Cu), aluminum (Al) or a combination thereof.

6. The field-effect transistor according to claim 1, wherein the linear-shaped barrier layer has a thickness substantially of 20 Å.

7. The field-effect transistor according to claim 1, wherein the dielectric layer is made of material selected from a group consisting of hafnium silicon, hafnium oxide, hafnium silicon oxide, hafnium silicon oxynitride, hafnium silicon nitride, hafnium aluminum oxide, aluminum oxide, titanium oxide, strontium titanium oxide, tantalum oxide, zirconium oxide, zirconium silicon oxide, lead lanthanum, zirconate titanate, barium strontium titanate and a combination thereof.

8. The field-effect transistor according to claim 7, wherein the dielectric layer further comprises an interface layer made of silicon oxide or silicon nitride directly in contact with the substrate.

9. The field-effect transistor according to claim 1, further comprising a silicide layer disposed on the titanium-rich surface of the linear-shaped barrier layer.

10. A field-effect transistor comprising:
a substrate;
a gate dielectric layer, disposed on the substrate;
a linear-shaped barrier layer having a titanium-rich surface and disposed on the gate dielectric layer, wherein a titanium concentration of the titanium-rich surface is higher than a titanium concentration within the linear-shaped barrier layer;
a U-shaped work function layer disposed above the titanium-rich surface;
a metal gate electrode, disposed above the U-shaped work function layer; and
a source/drain structure, formed in the substrate and adjacent to the metal gate electrode.

11. The field-effect transistor according to claim 10, wherein the field-effect transistor is a P type metal-oxide-semiconductor (PMOS) transistor and the work function layer comprises titanium nitride (TiN).

12. The field-effect transistor according to claim 10, wherein the field-effect transistor is an N type metal-oxide-semiconductor (NMOS) transistor and the work function layer comprises tantalum nitride (TaN), aluminum nitride (AlN), titanium aluminum nitride (TiAlN) or the combination thereof.

13. The field-effect transistor according to claim 10, further comprising a silicide layer disposed on the titanium-rich surface of the linear-shaped barrier layer.

* * * * *